United States Patent
Kung et al.

(10) Patent No.: US 10,184,956 B2
(45) Date of Patent: Jan. 22, 2019

(54) PROBE CARD

(71) Applicant: VIA Technologies, Inc., New Taipei (TW)

(72) Inventors: Chen-Yueh Kung, New Taipei (TW); Wen-Yuan Chang, New Taipei (TW); Wei-Cheng Chen, New Taipei (TW)

(73) Assignee: VIA Technologies, Inc., New Taipei (TW)

( * ) Notice: Subject to any disclaimer, the term of this patent is extended or adjusted under 35 U.S.C. 154(b) by 0 days.

(21) Appl. No.: 15/984,420

(22) Filed: May 21, 2018

(65) Prior Publication Data

US 2018/0267084 A1  Sep. 20, 2018

Related U.S. Application Data

(62) Division of application No. 14/149,822, filed on Jan. 8, 2014.

(30) Foreign Application Priority Data

Nov. 4, 2013 (TW) .............................. 102139998 A

(51) Int. Cl.
| | |
|---|---|
| *G01R 1/073* | (2006.01) |
| *G01R 1/20* | (2006.01) |
| *G01R 31/02* | (2006.01) |
| *G01R 31/26* | (2014.01) |
| *G01R 31/28* | (2006.01) |
| *H01L 21/66* | (2006.01) |
| *H01L 21/84* | (2006.01) |
| *H01R 12/06* | (2006.01) |

(52) U.S. Cl.
CPC ..... *G01R 1/07314* (2013.01); *G01R 1/07378* (2013.01)

(58) Field of Classification Search
CPC .......... G01R 1/073; G01R 1/20; G01R 31/02; G01R 31/26; G01R 31/28; H01R 21/66; H01R 21/84; H01R 12/06
See application file for complete search history.

(56) References Cited

U.S. PATENT DOCUMENTS

| | | | | |
|---|---|---|---|---|
| 2008/0030214 A1* | 2/2008 | Nguyen | ............. | G01R 1/06727 324/754.03 |
| 2010/0009471 A1* | 1/2010 | Mizoguchi | ......... | G01R 1/07378 438/15 |
| 2014/0210505 A1* | 7/2014 | Chen | .................... | G01R 1/0735 324/756.03 |
| 2015/0054541 A1* | 2/2015 | Lee | .................... | G01R 1/07378 324/756.03 |

\* cited by examiner

*Primary Examiner* — Neel Shah
(74) *Attorney, Agent, or Firm* — JCIPRNET

(57) ABSTRACT

A probe card including a circuit board, a transformer, a probe head, and a reinforcement structure is provided. The transformer including a body, a plurality of solder balls, and a plurality of first contact points are disposed on the substrate. The body has a first surface and a second surface, wherein the first surface is located between the circuit board and the second surface. The solder balls are disposed on the first surface, and the first contact points are disposed on the second surface. The probe head is disposed on the second surface. The probe head is electrically connected to the circuit board by the first solder balls. The reinforcement structure is disposed between the probe head and the circuit board.

6 Claims, 4 Drawing Sheets

PROBE CARD

CROSS-REFERENCE TO RELATED APPLICATION

This application is a divisional application of and claims the priority benefit of U.S. application Ser. No. 14/149,822, filed on Jan. 8, 2014, now allowed, which claims the priority benefit of Taiwan application serial no. 102139998, filed on Nov. 4, 2013. The entirety of each of the above-mentioned patent applications is hereby incorporated by reference herein and made a part of this specification.

BACKGROUND OF THE INVENTION

1. Field of the Invention

The present invention generally relates to a probe card, in particular, to a probe card having transformers.

2. Description of Related Art

It is required to perform electrical tests for integrated circuit (IC) chips at different stages of the semiconductor manufacture process. The electrical functionalities of each IC chip are ensured through the test of package and wafer. There are two factors contributing to the needs of product tests, which are the new design of chip and the increase in product yields. With the advance in functionalities and complication of chip, the needs for fast and accurate tests become even more important.

Wafer probing is done by forming a test circuit between a test platform and a probe card first, and then let the probe pin of the probe head on the probe card contact the pad or bump on the chip directly. By doing so, the signal in the chip may be collected by contacting the probe head with each chip on the wafer, and the signal is transmitted to the test platform for analysis.

A probe card usually includes a transformer, located between the probe head and the circuit board of the probe card, for the probe head to contact with the circuit board indirectly. Especially, a package substrate may be used as the transformer rather than making another transformer independently with some circumstance in order to reduce the cost of test. However, with the decrease in package size, the package substrate becomes thinner. In other words, if we use the package substrate as the transformer, the transformer also becomes thinner. Thus, bending and warping may occur easily during tests due to the decrease in thickness of the transformer, which impact the structure strength and the test result. In addition, the force exerted on the probe head during tests may be uneven because thinner transformer is not capable of providing strong supporting force. Therefore, how to increase the structure strength of probe card by reforming transformer has become an important issue.

SUMMARY OF THE INVENTION

Accordingly, the invention is directed to a probe card having a strong structure.

The invention is directed to a probe card, and the contact points of the transformer thereof have bumps so that the contact area is greater.

The invention is directed to a probe card, the transformer thereof includes a plurality of second external contact points, a package on package (POP) structure may be formed for the testing environment.

The probe card of the invention includes a circuit board, a transformer, a probe head and a reinforcement structure. The transformer is disposed on the circuit board, and the transformer has a body, a plurality of first solder balls, and a plurality of first contact points. The body has a first surface and a second surface, wherein the first surface is located between the circuit board and the second surface. The first solder balls are disposed on the first surface and the first contact points are disposed on the second surface. The probe head is disposed on the second surface. The probe head is electrically connected to the first contact point, and is connected to the circuit board through the first solder balls. The reinforcement structure is disposed between the probe head and the circuit board.

The probe card of the invention includes a circuit board, a transformer, and a probe head. The transformer is disposed on the circuit board. The transformer has a body, a plurality of first solder balls and a plurality of bumps. The body has a first surface and a second surface, wherein the first surface is located between the circuit board and the second surface. The first solder balls are disposed on the first surface and the first contact points are disposed on the second surface. The bumps are disposed on the second surface and protrude from the second surface. The probe head is disposed on the second surface. The probe head is electrically connected to the bump, and is connected to the circuit board through the first solder ball.

The probe card of the invention includes a circuit board, a transformer, a probe head, and at least a flexible circuit board. The circuit board has a plurality of first external contact points, disposed on a surface of the circuit board. The transformer is disposed on the circuit board, wherein the first external contact point is located on the side of the transformer. The transformer has a body, a plurality of first solder balls, a plurality of first contact points and a plurality of second external contact points. The body has a first surface and a second surface, wherein the first surface is located between the circuit board and the second surface. The first solder balls are disposed on the first surface, and the first contact points are disposed on the second surface. The second external contact points are disposed on the second surface and are located on the side of the first contact points. The probe head is disposed on the second surface. The probe head is electrically connected to the first contact point and is electrically connected to the circuit board through the first solder ball. The flexible circuit board is connected between the corresponding first external contact point and the second external contact point.

In conclusion, the probe card of the invention includes a reinforcement structure. The reinforcement structure is disposed between the probe head and the circuit board, so that the strength of the structure of the probe card is increased. In addition, the transformer of the probe card may include the bump protruding from the body, which increases the contact area between the transformer and the probe head. Moreover, the circuit board further includes a plurality of first external contact points. The transformer further includes a plurality of second external contact points, and the flexible circuit board is connected between the corresponding first external contact point and the corresponding second external contact point. Under such arrangement, the testing environment similar to a package on package (POP) structure may be formed when the probe card is connected to the device under test (e.g. chips) during tests.

Several exemplary embodiments accompanied with figures are described in detail below to further explain the disclosure in details.

BRIEF DESCRIPTION OF THE DRAWINGS

The accompanying drawings are included to provide a further understanding of the invention, and are incorporated

DESCRIPTION OF THE EMBODIMENTS

Figure 1A:
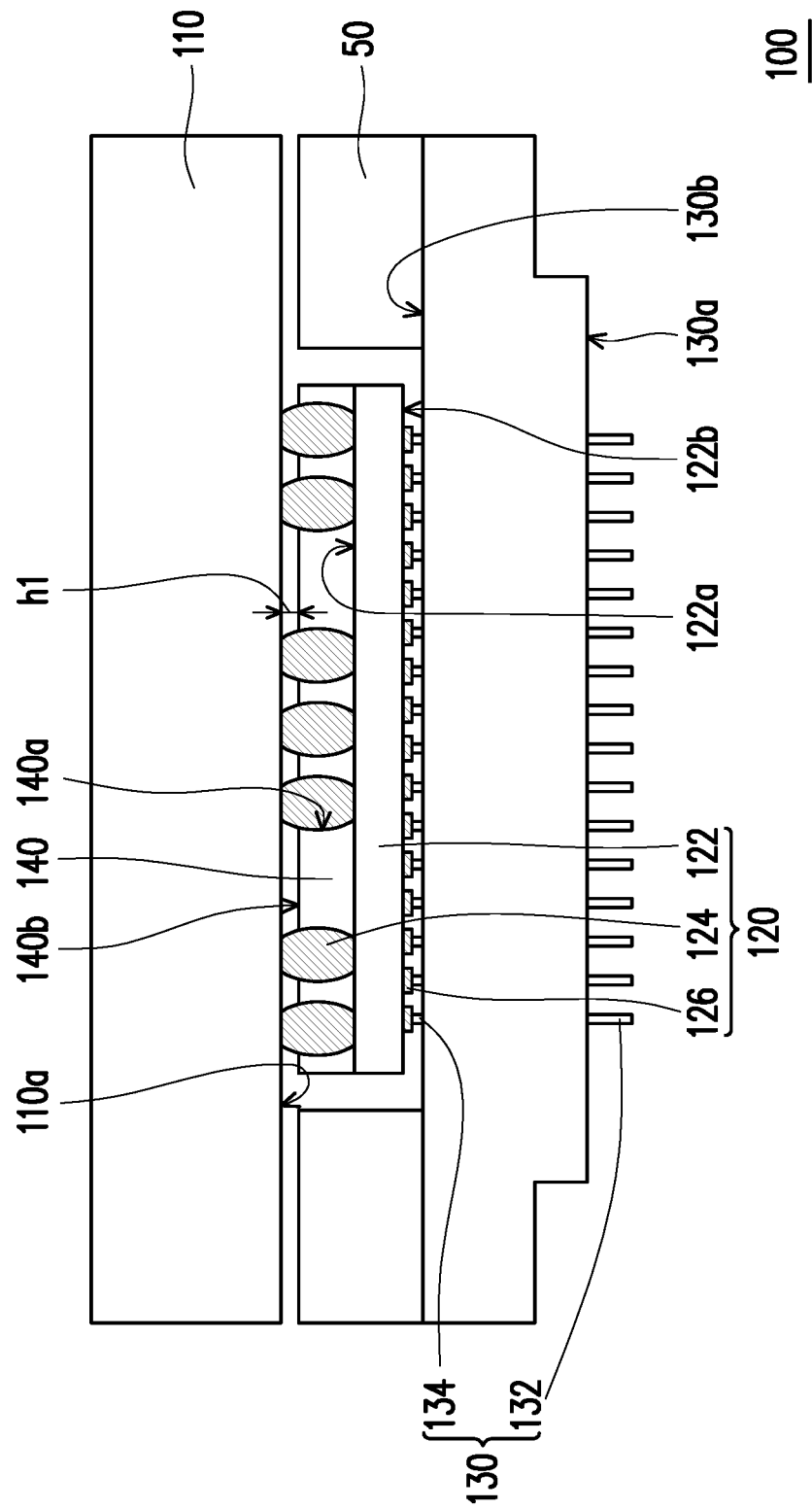
FIG. 1A is a schematic diagram of a probe card according to one embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1A is a schematic diagram of a probe card according to one embodiment of the invention. Referring to FIG. 1A, the probe card 100 includes a circuit board 110, a transformer 120, a probe head 130, and a reinforcement structure 140. A vertical type probe card is used to illustrate the probe card 100 in the present embodiment. As illustrated in FIG. 1A, the transformer 120 is disposed on the circuit board 110, and the transformer 120 includes a body 122, a plurality of first solder balls 124, and a plurality of first contact points 126. The body 122 has a first surface 122a and a second surface 122b, wherein the first surface 122a is located between the circuit board 110 and the second surface 122b. The first solder balls 124 are disposed on the first surface 122a, and the first contact points 126 are disposed on the second surface 122b. The probe head 130 is disposed on the second surface 122b. The probe head 130 is electrically connected to the first contact point 126, and is electrically connected to the circuit board 110 through the first solder balls 124.

In the present embodiment, a first side 130a of the probe head 130 is used for contacting the device under test (not shown), for example, a chip. In addition, a second side 130b of the probe head 130 is used for contacting the first contact point 126. In detail, the probe head 130 includes a plurality of probe pins 132 and a plurality of conductive pins 134, wherein the probe pin 132 is disposed on the first side 130a and the conductive pin 134 is disposed on the second side 130b, and the probe pin 132 and conductive pin 134 respectively indicate different sides of the same component. When tests are performed by the probe card 110, the device under test is contacted by the probe pin 132 in order for the signal from the device under test to be transmitted to the first contact point 126 of the transformer 120 through the conductive pin 134. Next, the signal is transmitted to the circuit board 110 through the first solder ball 124 of the transformer 120. In addition, as illustrated in FIG. 1A, a self-flatten component 50 may keep the probe card 100 horizontally when the test is performed by the probe card 100.

Reinforcement structure 140 is disposed between the probe head 130 and the circuit board 110. The reinforcement structure 140 may increase the strength of the transformer 120, which makes a strong structure for the probe card 100. Specifically, a package substrate is taken to be the transformer rather than making other transformers independently in some embodiments. The reinforcement structure 140 provided by the invention help to strengthen the entire structure of the probe card 100. The first solder ball 124 is connected between the first surface 122a and the circuit board 110. In the present embodiment, the reinforcement structure 140 is an encapsulant which is disposed on the first surface 122a and covers the first solder ball 124 so that the overall thickness of the transformer 120 may be increased, wherein the thickness of the transformer 120 includes the thickness of the body 122 and the thickness of the reinforcement structure 140. Increasing the thickness of the transformer 120 may increase the strength of the transformer 120, so that the bending and the warping may be avoided when the test is performed by the probe card 100. Moreover, the manufacture process of encapsulant is simple and costs less. In addition, extra and complicated manufacture processes are not needed when encapsulant is used for the reinforcement structure 140, therefore the cost is reduced.

In detail, when the probe card 100 of the present embodiment is manufactured, the first solder ball 124 is soldered on the first surface 122a of the body 122 first, then the encapsulant is made on the first surface 122a. The material of the first solder ball 124 may be, for example, a solder, and the material of the encapsulant may be, for example, epoxy resin compound or other polymer material composite. Next, a plurality of holes 140a may be made by using laser drilling on the encapsulant, wherein each corresponding first solder ball 124 is exposed from each hole 140a. Next, the transformer 120 is soldered on the circuit board 110 by using the first solder ball 124. In this way, the first solder ball 124 protrudes from the encapsulant, which makes a gap h1 between a top surface 140b of the encapsulant and a surface 110a of the circuit board 110.

Figure 1B:
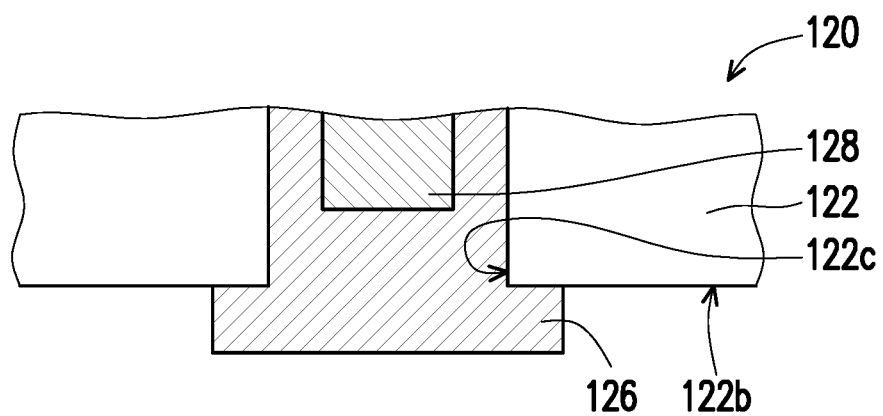
FIG. 1B is a schematic enlarged view of the first contact point in FIG. 1A.

As illustrated in FIG. 1A, the first contact point 126 of the present embodiment is a plurality of bumps which protrude from the second surface 122b. In some related art, contact points of a transformer do not protrude from the surface of the transformer. Contact points with bump type have greater contact area so that it is easier for the probe pin 132 of the probe head 130 to contact the first contact point 126. FIG. 1B is a schematic enlarge view of the first contact point in FIG. 1A. Referring to FIG. 1B, in detail, the body 122 has a plurality of openings 122c (only one hole is illustrated), and trace 128 of the transformer 120 is disposed in the openings 122c. The first contact point 126 fills in the opening 122c and is connected to the trace 128. Under such arrangement, the first contact point 126 is directly located on the trace 128 so that the configuration of bump on trace is formed. For the configuration of the contact point described above, the tightness of the contact points increases because it is not needed to reserve an alignment space. Worth to mention that the body 122 of the transformer 120 with protruded contact points 126 in the present embodiment may be, for example, a support substrate used in the chip package. By doing so, the real conditions of chips may be simulated during testing which makes the test result more accurate.

Figure 2:
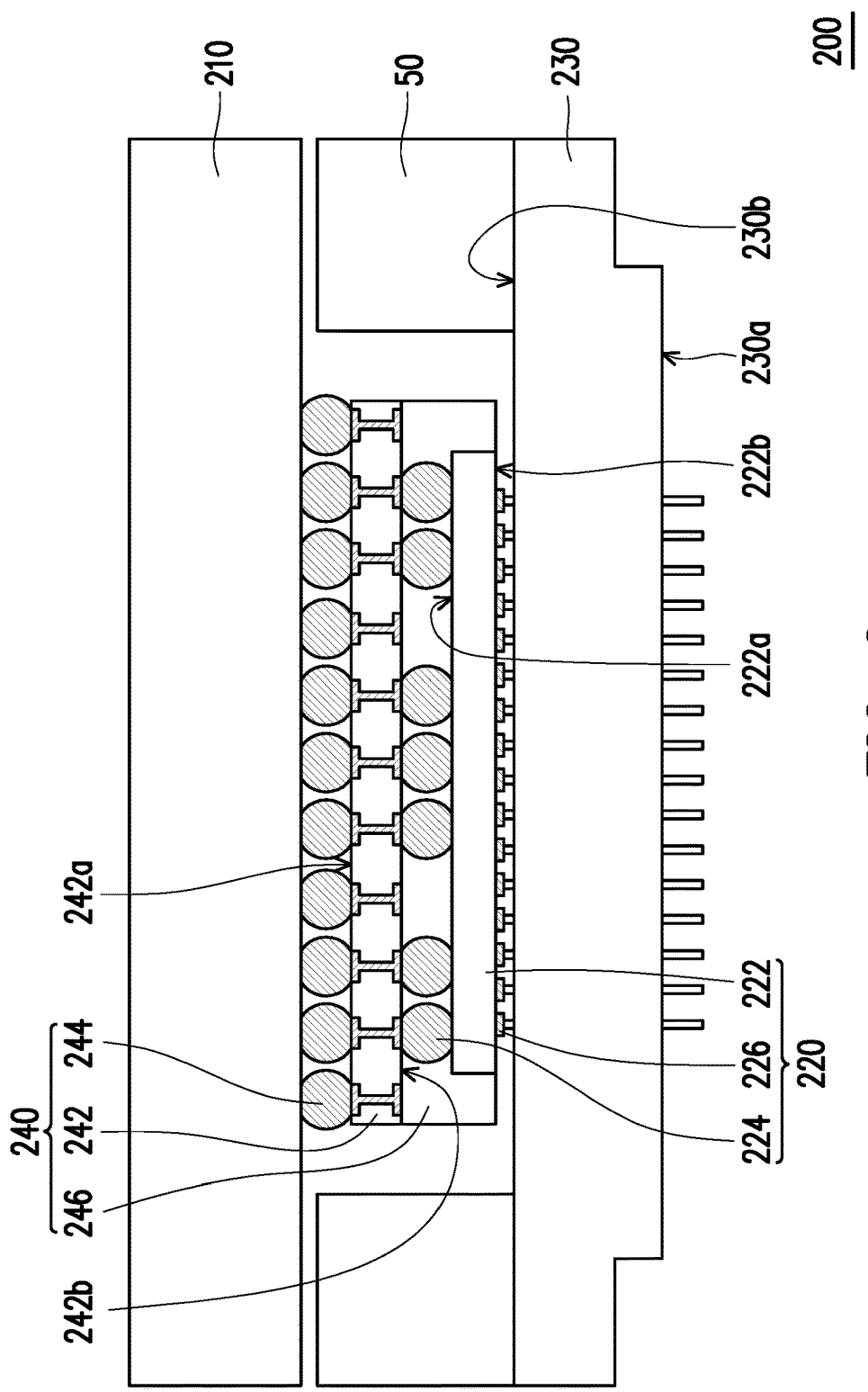
FIG. 2 is a schematic diagram of a probe card according to another embodiment of the invention.

FIG. 2 is a schematic diagram of a probe card according to another embodiment of the invention. Referring to FIG. 2, the probe card 200 includes a circuit board 210, a transformer 220, a probe head 230, and a reinforcement structure 240. A vertical type probe card is used to illustrate the probe card 200 in the present embodiment. As illustrated in FIG. 2, the transformer 220 is disposed on the circuit board 210, and the transformer 220 includes a body 222, a plurality of first solder balls 224, and a plurality of contact points 226. The body 222 has a first surface 222a and a second surface 222b, wherein the first surface 222a is located between circuit board 210 and the second surface 222b. The first solder balls 224 are disposed on the first surface 222a, and the first contact points 226 are disposed on the second surface 222b. The probe head 230 is disposed on the second surface 222b. The probe head 230 is electrically connected to the first contact point 226, and is electrically connected to the circuit board 210 through the first solder balls 224.

In the present embodiment, a first side 230a of the probe head 230 is used for contacting the device under test (not shown), for example, a chip. In addition, a second side 230b of the probe head 230 is used for contacting the first contact point 226. One may refer to the embodiment described above for description of this portion, description is not provided here. In addition, as illustrated in FIG. 2, a self-flatten component 50 may keep the probe card 200 horizontally when the test is performed by the probe card 200.

The reinforcement structure 240 is disposed between the probe head 230 and the circuit board 210. The reinforcement structure 240 may increase the structure strength of the entire probe card 200. Specifically, when the package substrate is used as the transformer and when the package substrate needs to be thinner, the reinforcement structure 240 may increase the structure strength of the entire probe card 200. In the present embodiment, the reinforcement structure 240 includes an interposer 242 and a plurality of second solder balls 244. The interposer 242 is disposed between the transformer 220 and the circuit board 210, and is electrically connected to the circuit board 210. The interposer 242 has a third surface 242a and a fourth surface 242b that are opposite to each other. The third surface 242a is located between the circuit board 210 and the fourth surface 242b, wherein the first solder ball 224 is connected between the first surface 222a and the fourth surface 242b, and the probe head 230 is electrically connected to the interposer 242 through the first solder ball 224. The second solder balls 244 are disposed on the third surface 242a and are connected between the third surface 242a and the circuit board 210, wherein the interposer 242 is electrically connected to the circuit board 210 through the second solder ball 244.

The interposer 242 disposed between the transformer 220 and the circuit board 210 may increase the thickness of the entire probe card 200, especially may increase the thickness between the circuit board 210 and the probe head 230. In this way, the probe card 200 has a strong structure. Moreover, the interposer 242 disposed between the transformer 220 and the circuit board 210 may adjust the circuit layout of the circuit board 210. For example, the circuit density of the circuit board 210 is decreased by increasing the space between wires. In this way, not only the flexibility of the circuit layout may be increased, but also the signal interference due to high density of circuit layout of the circuit board 210 may be avoided. The interposer 242 of the present embodiment may be used as a standard structure. For example, when the pitches between each pin of the probe pin 230 are different for various chip tests, but the pitches between each solder ball of the transformer are fixed, the same interposer 242 may be used to connect the transformer 220 and the circuit board 210 of the probe card 200.

As illustrated in FIG. 2, in the present embodiment, reinforcement structure 240 may optionally include an encapsulant 246. The encapsulant 246 is disposed on the fourth surface 242b and covers the body 222 of the transformer 220 and the first solder ball 224. The encapsulant 246 may increase the structure strength of the transformer 220. By doing so, the bending and the warping may be avoided when the test is performed by the probe card 200. In addition, using the encapsulant 246 as the reinforcement structure 240 does not need the extra and complicated manufacture process, and the cost is reduced. In the present embodiment, the encapsulant 246 covers the entire transformer 220 and the first contact point 226 on the second surface 222b of the transformer 220 is exposed. The first contact points 226 in the present embodiment may be a plurality of bumps protruding from the second surface 222b. The contact point with bump type has the advantage of greater contact area. One may refer to the aforementioned embodiment for the description of this portion.

Figure 3:
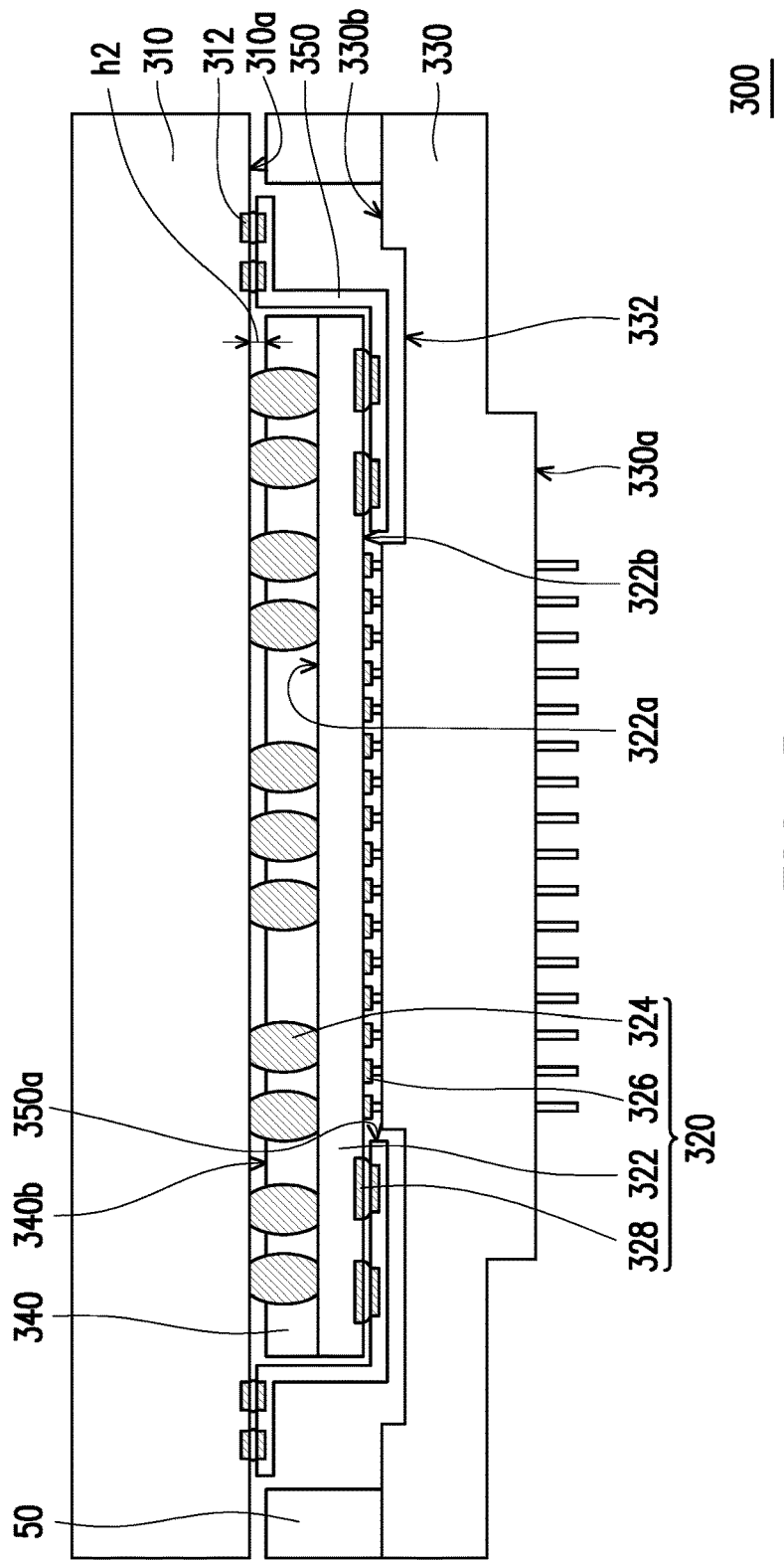
FIG. 3 is a schematic diagram of a probe card according to another embodiment of the invention.

FIG. 3 is a schematic diagram of a probe card according to one embodiment of the invention. Referring to FIG. 3, the probe card 300 includes a circuit board 310, a transformer 320, a probe head 330 and at least a flexible circuit board 350. A vertical type probe card is used to illustrate the probe card 300 in the present embodiment. The circuit board 310 has a plurality of first external contact points 312 which is disposed on a first surface 310a of the circuit board 310. The transformer 320 is disposed on the circuit board 310, wherein the first external contact point 312 is located on the side of the transformer 320, for example, on the outer side of the transformer 320.

The transformer 320 includes a body 322, a plurality of first solder balls 324, a plurality of first contact point 326 and a plurality of second external contact point 328. The body 322 has a first surface 322a and a second surface 322b, wherein the first surface 322a is located between the circuit board 310 and the second surface 322b. The solder balls 324 are disposed on the first surface 322a, and the first contact points 326 are disposed on the second surface 322b. The second external contact points 328 are disposed on the second surface 322b and are located on the side of the first contact points 326, for example, on the outer side of the first contact points 326. The probe head 330 is disposed on the second surface 322b. The probe head 330 is electrically connected to the first contact point 326, and is electrically connected to the circuit board 310 through the first solder ball 324. The flexible circuit board 350 is connected between the first external contact point 312 and the second external contact point 328 that are corresponding to each other.

In the present embodiment, a first side 330a of the probe head 330 is used for contacting the device under test (not shown), for example, a chip. In addition, a second side 330b of the probe head 330 is used for contacting the first contact point 326. One may refer to the aforementioned embodiment for the description of this portion, description will not be provided here. In addition, as illustrated in FIG. 3, a self-flatten component 50 may keep the probe card 300 horizontally when the test is performed by the probe card 300.

In the present embodiment, the second surface 322b of the transformer 320 is not only connected to the first contact point 326 of the probe head 330, but also further includes a plurality of second external contact points 328. Under such arrangement, the testing environment similar to a package on package (POP) structure may be formed when the probe card 300 is connected to the device under test (e.g. chips) during tests. In other words, when the package substrate used as the transformer and is a substrate for a package on package (POP) structure, the package substrate for POP structure has a first contact point 326 and a second external contact point 328 the same with contact points of the transformer 320, wherein the first contact point 326 is used as the contact point for a chip and the second external contact point 328 is used as the contact point for another package including another chip and another package substrate. In addition, the material of the transformer 320 of the body 322 in the present embodiment may be for example, the material of the package substrate of chips. By doing so, the real conditions of the chips may be simulated during testing, which makes the test result more accurate.

Note that the probe card illustrated in the present embodiment includes a flexible circuit board 350. As illustrate in FIG. 3, the flexible circuit board 350 has an opening 350a. The first contact point 326 are disposed in the opening 350a and are electrically connected to the probe head 330 by passing through the opening 350a. However, the invention does not limit the quantity of the flexible circuit board. In other embodiment not illustrated, the quantity of the flexible circuit board may be plural. Those flexible circuit boards are respectively disposed next to the transformer, and are connected between the first external contact point and the second external contact point.

As illustrated in FIG. 3, in the present embodiment, the probe head 330 includes a plurality of accommodating cavities 332 which are disposed at the second side 330b of the probe head 330. The accommodating cavity 332 faces the second surface 322b of the body 322, and a portion of each flexible circuit board 350 is contained in the accommodating cavity 332. In addition, the first contact points 326 of the present embodiment are a plurality of bumps protruding from the second surface 322b. The contact point with bump type has the advantage of greater contact area. One may refer to the aforementioned embodiment for the description of this portion.

As illustrated in FIG. 3, in the present embodiment, the probe card 300 further includes a reinforcement structure 340 which is disposed between the probe head 330 and the circuit board 310. The reinforcement structure 340 may increase the structure strength of the entire probe card 300. In particular, when the package substrate is used as the transformer and when the package substrate needs to be thinner, the reinforcement structure 340 may increase the structure strength of the entire probe card 300. The first solder ball 324 is connected between the first surface 322a and the circuit board 310. In the present embodiment, the reinforcement structure 340 is an encapsulant which is disposed on the first surface 322a and covers the first solder ball 324, which increases the thickness of the entire transformer 320, wherein the thickness of the transformer 320 includes the thickness of the body 322 and the thickness of the reinforcement structure 340. Increasing the thickness of the transformer 320 may increase the strength of the transformer 320, which the bending and the warping may be avoided when the test is performed by the probe card 300. Moreover, the manufacture process of encapsulant is simple and costs less. In addition, extra and complicated manufacture processes are not needed when an encapsulant is used for the reinforcement structure 340, therefore the cost is reduced. Worth to mention that the manufactured method of the reinforcement structure 340 of the present embodiment is similar to the embodiment illustrated in FIG. 1A. Thus, there is a gap h2 between a top surface 340b of the encapsulant and a surface 310a of the circuit board 310.

Note that the encapsulant being used for the reinforcement structure 340 in the present embodiment is for illustration only, the invention is not limited thereto. The reinforcement structure 340 may be in the form of interposer, for example, the embodiment in FIG. 2. Of course, when the interposer is included in the reinforcement structure 340, disposing encapsulant is optional. One may refer to the embodiment in FIG. 2 for the description of this portion, description will not be provided here.

In conclusion, the probe card of the invention includes a reinforcement structure, where in the reinforcement structure is disposed between the probe head and the circuit board in order to increase the structure strength of the probe card. The encapsulant or the interposer may be used for the reinforcement structure. The manufacture process is simplified and the manufacturing cost is lowered by using the encapsulant for the reinforcement structure. On the other hand, using the interposer for the reinforcement structure may decrease the density of the circuit board in the probe card, and the interposer may be used as a standard structure.

In addition, the transformer may include bump protruding from the body, which may increase the contact area between the transformer and the probe head. In addition, the circuit board further includes a plurality of first external contact points, and the transformer further includes a plurality of second external contact points. Under such arrangement, the testing environment similar to a package on package (POP) structure may be formed when the probe card is connected to the device under test during tests.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:
1. A probe card, comprising:
a circuit board;
a transformer disposed on the circuit board, and including:
   a body having a first surface and a second surface, wherein the first surface is located between the circuit board and the second surface;
   a plurality of first solder balls disposed on the first surface; and
   a plurality of first contact points disposed on the second surface;
a probe head disposed on the second surface, wherein the probe head is electrically connected to the first contact points, and is electrically connected to the circuit board through the first solder balls;
a reinforcement structure disposed between the probe head and the circuit board, wherein the first solder balls are connected between the first surface and the circuit board, the reinforcement structure includes an encapsulant disposed on the first surface and the encapsulant only covers the first solder balls, a thickness of the encapsulant measured from the first surface is greater than half of a height of each of the first solder balls measured from the first surface, and the thickness of the encapsulant measured from the first surface is less than the height of each of the first solder balls measured from the first surface, and wherein the first contact points are a plurality of bumps protruding from the second surface, the body has a plurality of openings, a trace of the transformer is disposed in each of the plurality of openings, and each of the first contact points fills in the corresponding opening and is connected to the corresponding trace; and
at least a flexible circuit board, wherein the circuit board has a plurality of first external contact points, the first external contact points are disposed on a surface of the circuit board and are located on the side of the transformer, the transformer further includes a plurality of second external contact points, the second external contact points are disposed on the second surface and are located on the side of the first contact points, and the at least flexible circuit board is connected between the first external contact points and the second external contact points.

2. The probe card according to claim 1, wherein the probe head includes a plurality of accommodating cavities, the accommodating cavities face the second surface, and a portion of the flexible circuit board is in the accommodating cavity.

3. A probe card, comprising: a circuit board having a plurality of first external contact points, disposed on a surface of the circuit board; a transformer disposed on the circuit board, wherein the first external contact points are located on the side of the transformer, and the transformer includes: a body having a first surface and a second surface, wherein the first surface is located between the circuit board and the second surface; a plurality of first solder balls disposed on the first surface; a plurality of first contact points disposed on the second surface; a plurality of second external contact points disposed on the second surface and located on the side of the first contact points; and wherein the contact points are plurality of bumps protruding from the second surface, the body has a plurality of openings, a trace of the transformer is disposed in each of the plurality of openings, and each of the first contact points fills in the corresponding opening and is connected to the corresponding trace; a probe head disposed on the second surface, wherein the probe head is electrically connected to the first contact points, and is electrically connected to the circuit board through the first solder balls; and at least a flexible circuit board connected between the first external contact points and the second external contact points.

4. The probe card according to claim 3, wherein the probe head includes a plurality of accommodating cavities, the plurality accommodating cavities face the second surface, and a portion of the flexible circuit board is in the accommodating cavity.

5. The probe card according to claim 3, further comprising a reinforcement structure, disposed between the probe head and the circuit board, and the first solder balls are connected between the first surface and the circuit board, and the reinforcement structure includes:
   an encapsulant disposed on the first surface and covering the first solder balls.

6. The probe card according to claim 5, wherein the first solder balls protrude from the encapsulant so that there is a gap between a top surface of the encapsulant and the circuit board.

* * * * *